(12) United States Patent
Morita et al.

(10) Patent No.: US 7,888,912 B2
(45) Date of Patent: Feb. 15, 2011

(54) BATTERY SOC ESTIMATION PROGRAM, WIRELESS TRANSIT SYSTEM, AND METHOD OF CHARGING THE BATTERY

(75) Inventors: Katsuaki Morita, Hiroshima-ken (JP); Masaya Mitake, Hiroshima-ken (JP); Masahiro Yamaguchi, Hiroshima-ken (JP); Hiroshi Yamashita, Hiroshima-ken (JP); Masaomi Yamada, Hiroshima-ken (JP); Kousuke Katahira, Hiroshima-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 152 days.

(21) Appl. No.: 12/302,851

(22) PCT Filed: Nov. 29, 2007

(86) PCT No.: PCT/JP2007/073536
§ 371 (c)(1),
(2), (4) Date: Nov. 28, 2008

(87) PCT Pub. No.: WO2008/066203
PCT Pub. Date: Jun. 5, 2008

(65) Prior Publication Data
US 2009/0195219 A1 Aug. 6, 2009

(30) Foreign Application Priority Data
Nov. 30, 2006 (JP) .............................. 2006-324643

(51) Int. Cl.
*H02J 7/00* (2006.01)
(52) U.S. Cl. ....................... 320/132; 320/109
(58) Field of Classification Search ................. 320/109; 324/429, 430
See application file for complete search history.

(56) References Cited

U.S. PATENT DOCUMENTS 5,298,849 A * 3/1994 Drexel et al. ................. 320/109

(Continued)

FOREIGN PATENT DOCUMENTS

| JP | 6343203 A | 12/1994 |
|----|-----------|---------|
| JP | 10108380 A | 4/1998 |
| JP | 2003090869 A | 3/2003 |
| JP | 2006054958 A | 2/2006 |
| JP | 2007189768 A | 7/2007 |

OTHER PUBLICATIONS

Singapore Written Opinion for SG200808437-8 dated Mar. 1, 2010.
ISR for WO 2008/066203 dated Jan. 29, 2008.

*Primary Examiner*—Edward Tso
*Assistant Examiner*—Ramy Ramadan
(74) *Attorney, Agent, or Firm*—Kanesaka Berner and Partners LLP

(57) ABSTRACT

Occurrence of overcharging and over discharging of batteries mounted on vehicles that travel on tracks in a wireless transit system is prevented by estimating a state of charge (SOC) of the batteries with accuracy. An equivalent circuit of the battery is composed of three circuit elements connected in series, including (i) a first component resistance R1 (ii) a component circuit which includes a capacitance C and a second component resistance R2 connected in parallel and (iii) an open circuit voltage of the battery. The open circuit voltage of the equivalent circuit is calculated using R1 calculated from measurements of current and voltage of the battery, as well as values k=R2/R1 and τ=C×R2. The SOC if the battery is calculated from the open circuit voltage.

16 Claims, 8 Drawing Sheets

U.S. PATENT DOCUMENTS

| | | | |
|---|---|---|---|
| 5,654,621 A * | 8/1997 | Seelig ........................ 320/108 |
| 7,009,401 B2 | 3/2006 | Kinoshita et al. |
| 7,324,902 B2 | 1/2008 | Verbrugge et al. |
| 2004/0162683 A1 * | 8/2004 | Verbrugge et al. ............ 702/64 |

* cited by examiner $$\begin{cases} V = E - IR_1 + V_C & \cdots\cdots (1) \\ I = -C\dfrac{dV_C}{dt} - \dfrac{V_C}{R_2} & \cdots\cdots (2) \end{cases}$$

BATTERY SOC ESTIMATION PROGRAM, WIRELESS TRANSIT SYSTEM, AND METHOD OF CHARGING THE BATTERY

RELATED APPLICATIONS

The present application is based on International Application Number PCT/JP2007/073536 filed Nov. 29, 2007, and claims priority from Japanese Application Number 2006-324643 filed Nov. 30, 2006, the disclosures of which are hereby incorporated by reference herein in their entirety.

TECHNICAL FIELD

The present invention relates to a battery SOC (State of Charge) estimation program, a wireless transit system in which battery mounted vehicles travel receiving electric power from the batteries, and a method of charging the batteries.

BACKGROUND ART

In a wireless transit system in which vehicles mounted with batteries travel by receiving electric power from the batteries, it is necessary that the batteries be charged by ground charging equipment. Ground charging equipment is provided at a plurality of premises such as stations because the battery is limited in its capacity to store electricity. However, stoppage time of the vehicles at stations is short, so fast charging of batteries is demanded. Also, it is needed to detect SOC (State of Charge) of the batteries to control over adequate SOC thereof by preventing over charge or over discharge. However, as power supply from the batteries is needed even when the vehicle is making a stop, detection of battery SOC by measuring open-circuit voltage of the battery cannot be performed.

In document 1 (Japanese Laid-Open Patent Application No. 10-108380) is disclosed an apparatus and a method for charging a secondary battery for an electric car intended to make possible energy recovering with increased recovering efficiency under all environments. According to the invention of the document 1, charging power is controlled to be optimum by comparing DOD % (depth of discharge; ratio of discharged quantity of electricity to the rated capacity of battery) of the battery allowable for charging calculated from the temperature and voltage of the secondary battery with a DOD limit value allowable for charging memorized beforehand in a memory circuit, the DOD limit value being determined dependent upon temperature, DOD, and voltage of the secondary battery.

In document 2 (Japanese Patent Application No. 2006-003637) applied for by the applicant of the present invention is suggested a charging method in a wireless transit system, by which method voltage of the battery mounted on the vehicle is detected and charging is stopped when the detected voltage reaches a predetermined charge terminating voltage. However, as characteristic of internal resistance of battery varies depending on temperature of the battery, accurate estimation of batter SOC is difficult and errors occur under temperature variant environment.

According to an embodiment disclosed in FIG. 5 of document 2, a temperature control means is provided, and battery temperature is maintained to a temperature desirable for SOC of the battery. By this, control accuracy of SOC susceptible to temperature is improved, over charging is prevented, thereby curbing deterioration of battery.

According to document 1, charging power is controlled to be optimum by comparing DOD of the battery allowable for charging calculated from the temperature and voltage of the secondary battery with a DOD limit value allowable for charging determined dependent upon temperature, DOD, and voltage of the secondary battery memorized beforehand in a memory circuit, however, internal resistance of the battery changes depending on battery temperature variation and DOD (depth of discharge) allowable for charging varies according to the variation of internal resistance, so onerous control is needed taking temperature variation into consideration.

The method disclosed in document 2 has an advantage that influence of battery temperature variation is eliminated by providing the temperature control means for the battery, however, the provision of the battery temperature control device causes a problem of complication in structure.

There is known a method of estimating battery SOC by current integration. As charge and discharge of a battery is grasped by integral of battery current with respect to time (ampere hour) by integrating measured battery current by time. SOC of a battery mounted on a vehicle can be estimated by the current integration method, however, error of current measurement is accumulated and error of estimation of battery SOC increases as integration time increases.

DISCLOSURE OF THE INVENTION

The present invention was made in light of the aforementioned background, and the object of the invention is to maintain SOC of batteries mounted on vehicles which travel on predetermined tracks by electric power supplied from the batteries in an appropriate range of battery SOC by estimating online with accuracy, thereby preventing occurrence of over-charging or over discharging of the batteries that will result in prevention of deterioration of the batteries, and at the same time to make quick charging of the batteries possible by enabling increase of charging current when charging the batteries.

To attain the object, the present invention proposes a battery SOC estimation program for running a computer to calculate state of charge (SOC) of a battery mounted on a vehicle in a wireless transit system, wherein an equivalent circuit of the battery is set in the program, the equivalent circuit being composed of three circuit elements connected in series, a first component resistance which is influenced by instantaneous current variation, a circuit component consisting of a capacitance and a second component resistance connected in parallel which is influenced by slow and excessive response, and an open circuit voltage of the battery, and wherein the program runs the computer to calculate open circuit voltage of the equivalent circuit using a value of the first component resistance calculated from measurement of current and voltage of the battery and value of k(=the second component resistance/the first component resistance) and τ(=the capacitance×the second component resistance) which are constant values specific to the battery determined based on measurements, and to calculate state of charge of the battery from the open circuit voltage.

In the battery SOC estimation program of the invention is set an equivalent circuit of the battery as shown in FIG. 1a. The equivalent circuit consists of three circuit elements connected in series, which are a first component resistance $R_1$ which is influenced by instantaneous current variation, a component circuit consisting of a capacitance C and a second component resistance $R_2$ connected in parallel which is influenced by slow and excessive response, and an open circuit voltage E of the battery. Values of the elements vary depending on environment conditions such as temperature. Vc is polarization potential of C in the CR2 circuit, and E is electromotive force of the battery, i.e. open circuit voltage of the equivalent circuit. Relations between the current I and voltage V of the equivalent circuit are presented by equations (1) and (2) in FIG. 1b.

Terminal voltage V of the equivalent circuit when current is flowing a sum of the E and Vc minus a voltage drop ($I \cdot R_1$) through the resistance $R_l$. Therefore, by knowing internal resistances, open circuit voltage E of the equivalent circuit can be calculated from current and voltage during charging operation. The first component resistance $R_1$ can be calculated for example from a voltage drop when discharging is started.

The inventors of this invention found that both measurement values of k=(the second component resistance)/(the first component resistance) and τ=(capacitance of the component circuit)×(the second component resistance) are about constant for every battery not influenced by battery temperature. On the basis of this finding, voltage Vc of the component circuit CR2 can be calculated using calculated value of first component resistance $R_1$, and constant values of k and τ determined for batteries based on measurements.

With voltage Vc of the component circuit CR2 calculated, open circuit voltage E of the equivalent circuit can be calculated from the equation (1) of FIG. 1b. With open circuit voltage E calculated, battery SOC can be calculated because there is a specific relation determined in accordance with battery characteristic between open circuit voltage E and battery SOC as well known in the field of the art.

As SOC of the battery mounted on the vehicle can be estimated online, battery SOC can be maintained in an appropriate range and occurrence of overcharging of over discharging of the battery can be prevented, resulting in prevention of deterioration of the battery, and at the same time charging current when charging the battery can be increased.

Moreover, as internal resistance of the battery internal resistance of the secondary battery 14 can be monitored, the result can be used effectively for evaluating SOH (State of Health) of the secondary battery.

Further, the invention proposes a wireless transit system for allowing a vehicle mounted with a battery unit and equipped with a computer which operates under a battery SOC estimation program to travel on predetermined tracks by electric power supplied from the battery unit, wherein ground facilities each comprising a charging power source device and a ground power supply device connected to the charging power source device are established along the predetermined tracks, and the vehicle is provided with an in-vehicle power receiving device such that the power receiving device faces the ground power supply device when the vehicle makes a stop at a charging position in any of the ground facilities, means to detect current and voltage of the battery unit, a battery SOC calculating means comprising a computer which runs under the battery SOC estimation program, and a charge control device for controlling charging of the battery unit so that the charging of the battery unit is performed by the ground power supply device based on battery SOC calculated by the battery SOC calculating means.

A wireless transit system has advantages that construction cost can be reduced and maintenance cost of overhead wire is made redundant because the overhead wire can be eliminated by mounting batteries for supplying power to drive the vehicle, and that kinetic energy of the vehicle can be recovered efficiently to the batteries for reutilization when decelerating the vehicle.

According to the wireless transit system of the invention, charging of the batteries mounted on the vehicle is performed from ground charging facilities. The vehicle is allowed to make a stop at such a position that the in-vehicle power receiving device of the vehicle faces a ground power supply device of ground charging facilities provided at some positions along predetermined tracks in order to perform non-contact charging of the batteries mounted on the vehicle. As the vehicle is equipped with the battery SOC calculating device having a computer which runs under the battery SOC estimation program, charging can be performed while estimating SOC of the battery online as described in the foregoing. As the charge control means is provided in the vehicle to control charging based on battery SOC estimated by the battery SOP calculating device so that the battery is charged from the ground power supply device to an appropriate range of estimated SOC, occurrence of overcharging and over discharging can be prevented.

Furthermore, the invention proposes a method of charging the battery unit mounted on the vehicle from the ground charging facility in the wireless transit system constituted as mentioned above, wherein charging of the battery unit is performed so that charging current does not exceed an upper limit of charging current determined in consideration of the difference between a predetermined upper limit value and calculated value of open circuit voltage of the battery unit, and charging is stopped when SOC of the battery unit calculated by the battery SOC calculating means reaches a predetermined SOC.

According to the charging method of the invention, an upper limit of charging current is set in consideration of the difference between a predetermined upper limit value and calculated value of open circuit voltage of the battery, and charging is performed so that charging current does not exceed the upper limit, so occurrence of overcharging can be prevented. Besides, charging is stopped when SOC of the battery unit calculated by the battery SOC calculating means reaches a predetermined SOC, so the battery can be charged to a desired SOC in an appropriate range of SOC.

According to the battery SOC estimation program of the invention, SOC of the battery mounted on the vehicle can be calculated online, so battery SOC can be maintained in an appropriate range, therefore occurrence of overcharging and over discharging of the battery can be prevented, and deterioration of the battery can be prevented. Besides, it is possible to increase charging current to an upper limit value determined in consideration of the difference between a predetermined upper limit value and calculated value of open circuit voltage of the battery, so quick charging is possible when the vehicle makes a stop at a station.

Moreover, as internal resistance of the battery internal resistance of the secondary battery 14 can be monitored, the result can be used effectively for evaluating SOH (State of Health) of the secondary battery.

According to the wireless transit system of the invention, the vehicle is equipped with the battery SOC calculating device having a computer which runs under the battery SOC estimation program, charging can be performed while estimating SOC of the battery online. Further, as the charge control means is provided in the vehicle to control charging based on battery SOC estimated by the battery SOP calculating device so that the battery is charged from the ground power supply device to an appropriate range of estimated SOC, occurrence of overcharging and over discharging can be prevented, and as a result deterioration of the battery can be prevented. Besides, it is possible to increase charging current to an upper limit value determined in consideration of the difference between a predetermined upper limit value and calculated value of open circuit voltage of the battery, so quick charging is made possible to perform when the vehicle makes a stop at a station.

Further, according to the charging method, upper limit of charging current is determined in consideration of the difference between a predetermined upper limit value and calculated value of open circuit voltage of the battery, and the battery is charged so that charging current does not exceed the upper limit, so overcharging is prevented, as a result, deterioration is prevented. Charging is stopped when SOC of the battery unit calculated by the battery SOC calculating means reaches a predetermined SOC, so the battery can be charged to a desired SOC in an appropriate range of SOC.

BEST EMBODIMENT FOR IMPLEMENTING THE INVENTION

Preferred embodiments of the present invention will now be detailed with reference to the accompanying drawings. It is intended, however, that unless particularly specified, dimensions, materials, relative positions and so forth of the constituent parts in the embodiments shall be interpreted as illustrative only not as limitative of the scope of the present invention.

Figure 2:
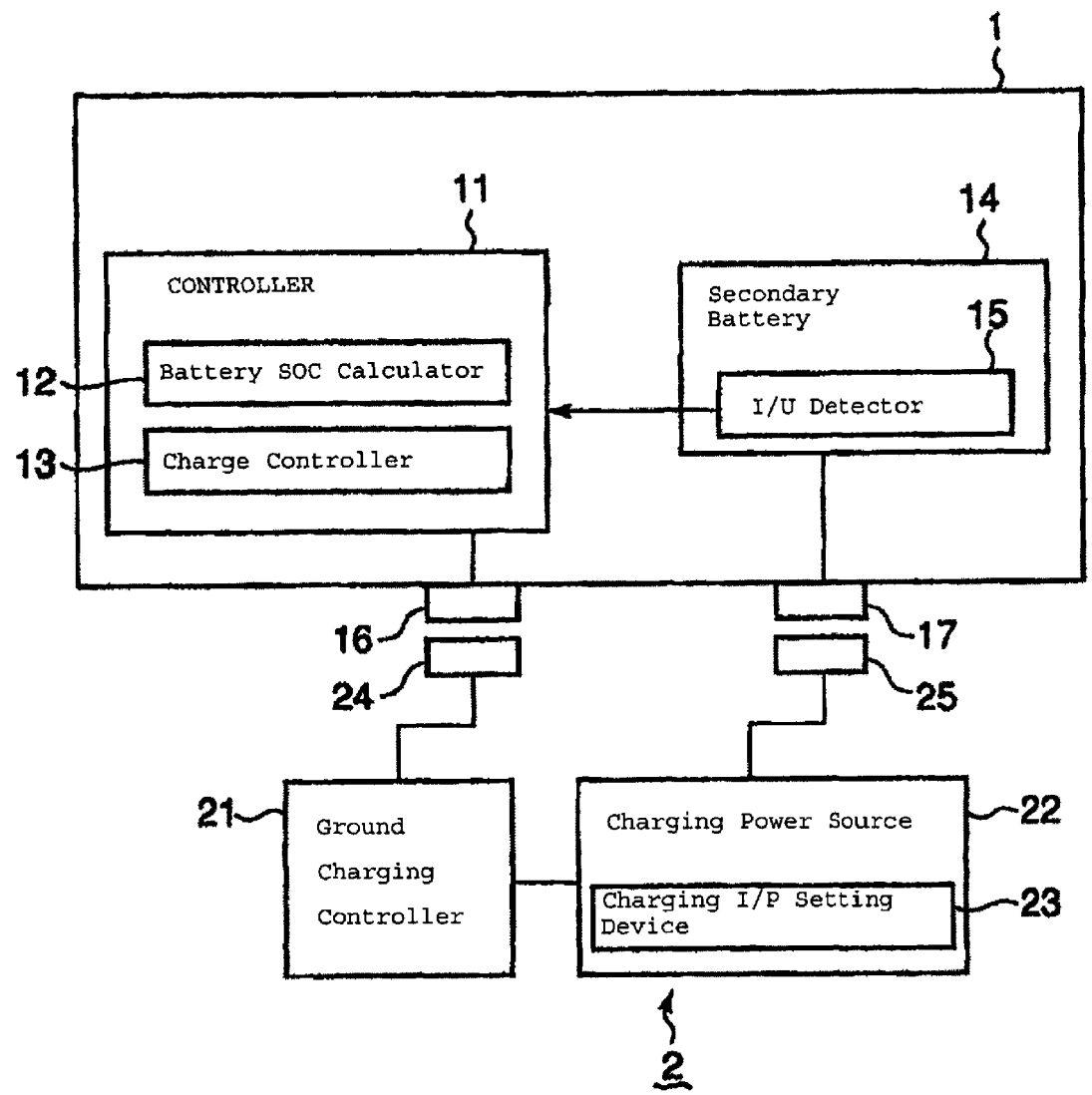
FIG. 2 is an embodiment of the wireless transit system according to the present invention.

FIG. 2 is an embodiment of a wireless transit system according to the present invention. Referring to FIG. 2, a vehicle 1 is a vehicle that travels on predetermined tracks, for example a vehicle travels in a LRT transit system. A controller 11 for controlling the vehicle totally including traveling and others is mounted on the vehicle 1. A secondary battery 14 such as a lithium ion secondary battery is mounted on the vehicle 1, current and voltage of the secondary battery 14 are detected by a current and voltage detecting means 15, and the detected values are sent to the controller 11.

In the controller 11 are installed a charged state battery SOC calculating means 12 having a computer which operates under the program for estimating SOC of the secondary battery 14, and a charge control means 13 for controlling SOC of the secondary battery 14 based on the SOC of the secondary battery 14 estimated by the calculating means 12. Charge control will be performed by the control means while communication being established between an in-vehicle communication device 16 mounted on the vehicle 1 and a ground communication device 24 of a ground charging control equipment 21 provided on the ground.

Moreover, an in-vehicle power receiving device 17 is installed on the vehicle 1 for receiving electric power from a ground power supply device 25. Non-contact power supply is performed from the ground power supply device 25 to the in-vehicle power receiving device 17 when the vehicle 1 makes a stop so that the in-vehicle power receiving device 17 faces the ground power supply device 25 to charge the secondary battery 14.

Ground charging facilities 2 are provided in premises such as stations, a charging power source device 22 and the ground charging control equipment 21 are installed in the ground facility, and electric power is supplied to the vehicle from the charging power source device 22 via the ground power supply device 25. The charging power source device 22 is provided with a charging current (power) setting means 23. Electric power to be supplied from the charging power source device 22 is determined beforehand by the charging current (power) setting means 23. The charging power source device 22 stops current supply upon receiving a charge stop signal form the ground charging control equipment 21.

Ordinary, target SOC of the battery to stop charging is set to be in a rage of about 60 to 85% in order to prevent occurrence of over charge or over discharge while the vehicle is traveling, even if variation of characteristic of the battery depending on temperature is taken into consideration. Target SOC to stop charging and charging current determined beforehand may be varied depending on stations at which batteries are charged. The larger the charging current is, the more quickly the battery is charged.

Figure 1A:
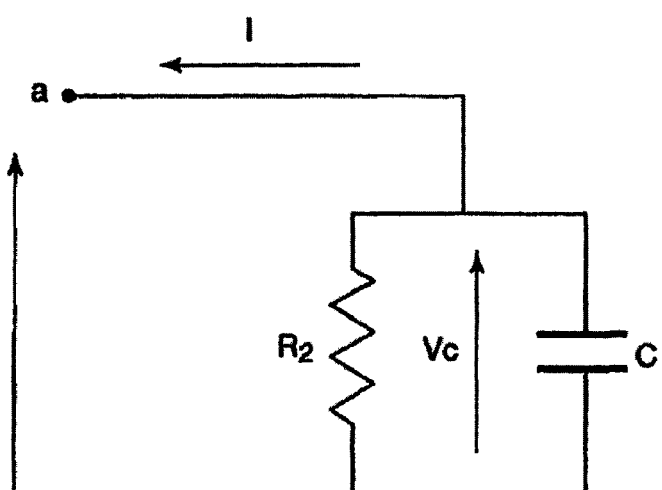
FIG. 1a is a circuit diagram showing an equivalent circuit of a battery.
Figure 1B:
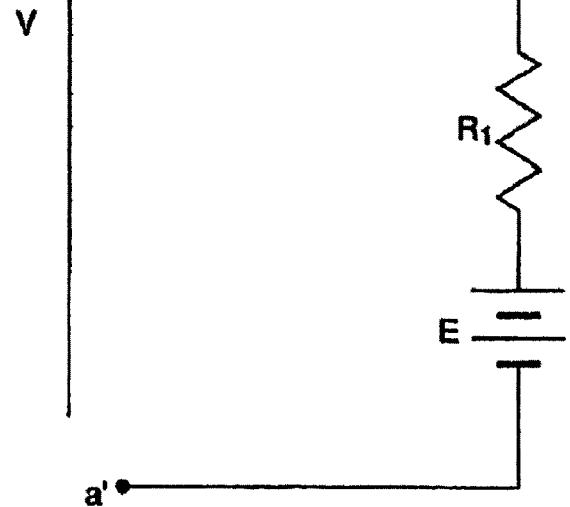
FIG. 1b shows a relational expression of voltage and that of current.
Figure 3:
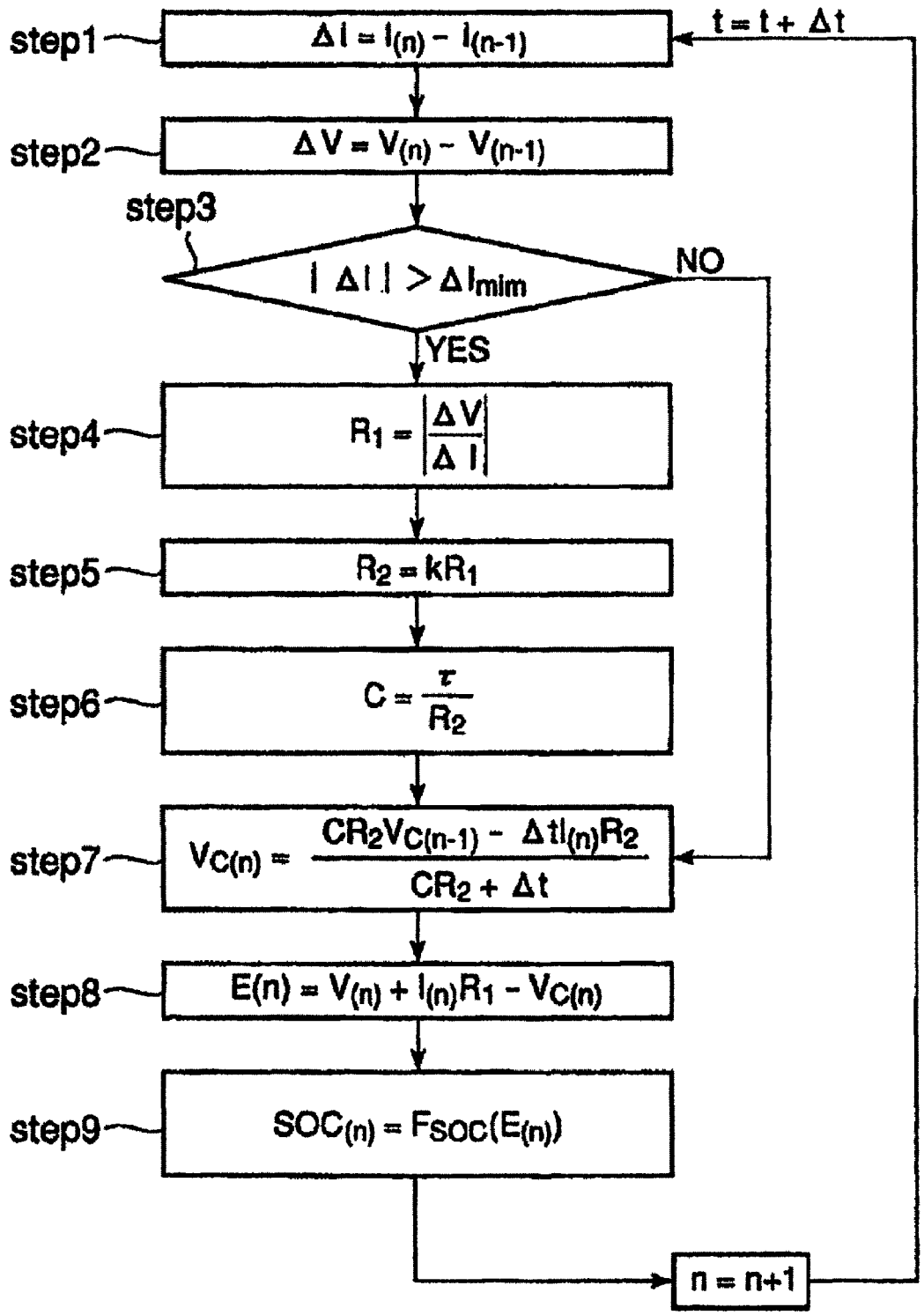
FIG. 3 is a flowchart of the battery SOC estimating program according to the invention.

FIG. 3 is a flowchart of a battery SOC estimating program to run a computer installed in the battery SOC calculating means 12. In the program is prepared the equivalent circuit shown in FIG. 1 as the equivalent circuit of the secondary battery 14.

Values of elements in the equivalent circuit are calculated online according to the flowchart of FIG. 3. Referring to FIG. 3, firstly variations in current and voltage of the secondary battery 14 are detected online by the current and voltage detecting means 15 (steps 1 and 2), first component resistance $R_1$ is calculated from the variations (step 4). When detected variation of current is smaller than a smallest preset value, it is regarded as noise and calculation of values of the first component resistance $R_1$, second component resistance $R_2$, and capacitance C is not performed, instead value of Vc calculated in the previous flow is used (step 3).

Values of k=resistance of $R_2$/resistance of $R_1$, and $\tau=C \times R_2$ are constant value specific to the battery 14. Voltage changes exponentially and saturates in an equivalent component circuit consisting of the second component resistance $R_2$ and capacitance C. Resistance of the second component resistance $R_2$ is obtained by dividing the last voltage variation $\Delta V$ with which the voltage is saturated by the current. Time elapsed until voltage changes to about 63% of the voltage variation $\Delta V$ is the time constant $\tau$ which is a product of the capacitance C and second component resistance $R_2$. Ratio of the second component resistance $R_2$ to the first component resistance $R_1$ is k.

Figure 4:
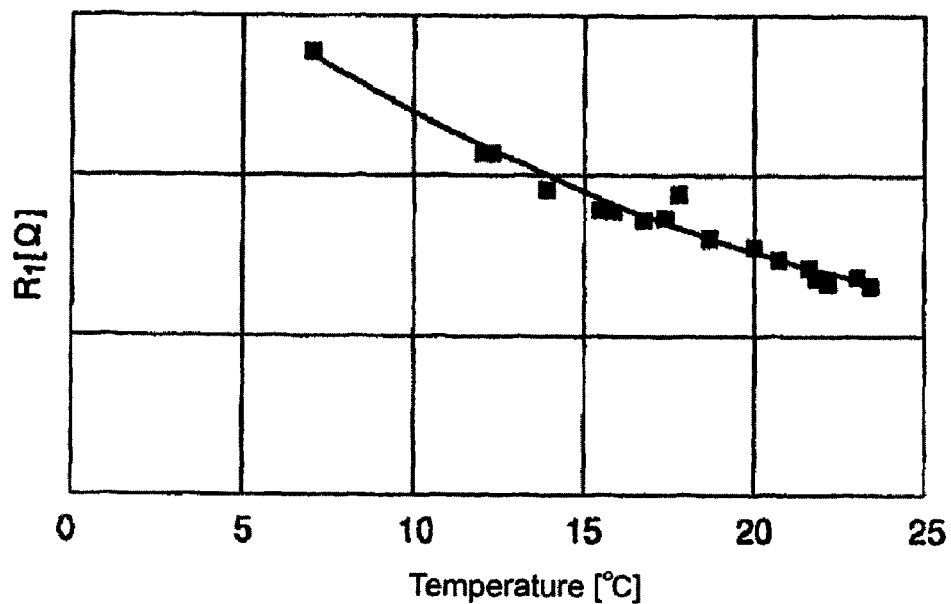
FIG. 4 is a graph showing a relation between the first component resistance $R_1$ versus temperature.
Figure 5:
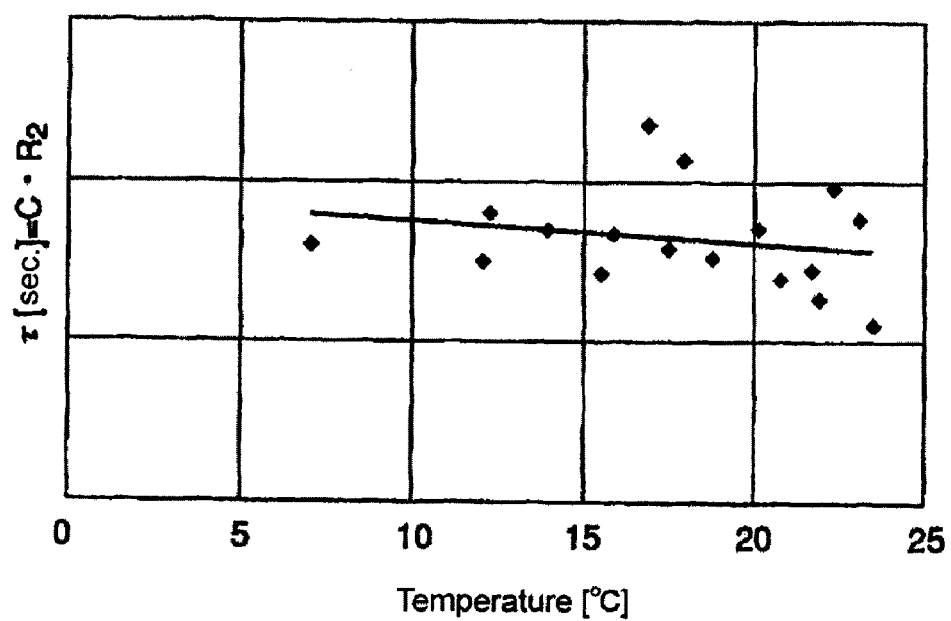
FIG. 5 is a graph showing a relation between $\tau(=C \times R_2)$ versus temperature.
Figure 6:
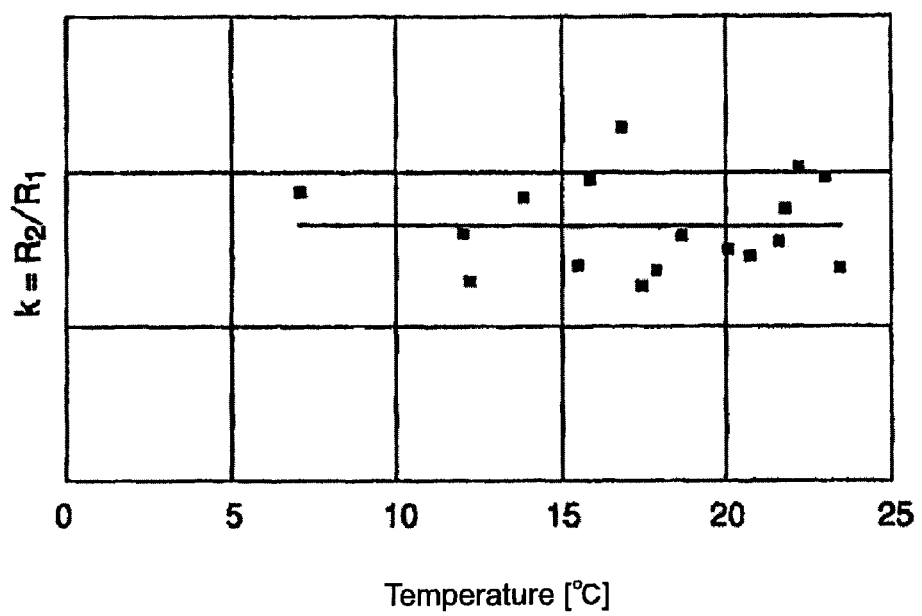
FIG. 6 is a graph showing a relation between $k(=R_2/R_1)$ versus temperature.

FIG. 4 is a graph showing a relation between the first component resistance $R_1$ versus temperature, FIG. 5 is a graph showing a relation between $\tau(=C \times R_2)$ versus temperature, and FIG. 6 is a graph showing a relation between k(=$R_2$/$R_1$) versus temperature. In the graphs of FIGS. 3 to 6, actual measurement values are plotted. As can be recognized from the graphs, the first component resistance $R_1$ varies depending on temperature, but τ and k do not depend on temperature and a constant value respectively which is specific to the second battery 14, although the measurement values scatter somewhat.

Figure 7:
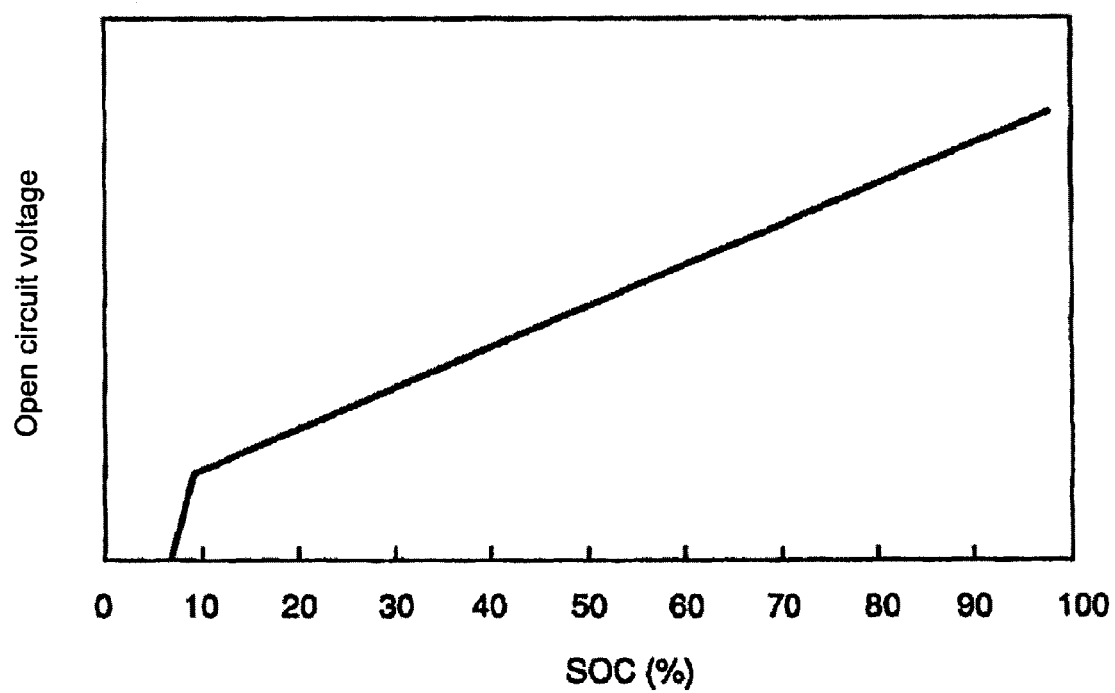
FIG. 7 is a graph showing schematically an example of relation of open circuit voltage E versus SOC of a charged battery.

In FIG. 3, voltage Vc of the equivalent component circuit consisting of the capacitance C and second component resistance $R_2$ can be calculated by substituting the values of the second component resistance $R_2$ and capacitance C calculated in steps 5 and 6 into an equation of step 7. Then by substituting the calculated value of Vc into an equation of step 8, open circuit voltage E which corresponds to electromotive force of the battery can be calculated. As a relation between the open circuit voltage E and battery SOC is determined by a function defined by the specific characteristic of the secondary battery 14, SOC of charged battery can be calculated using the open circuit voltage E as shown in step 9. An example of relation of open circuit voltage E versus SOC of a charged battery is showing schematically in FIG. 7.

Figure 8:
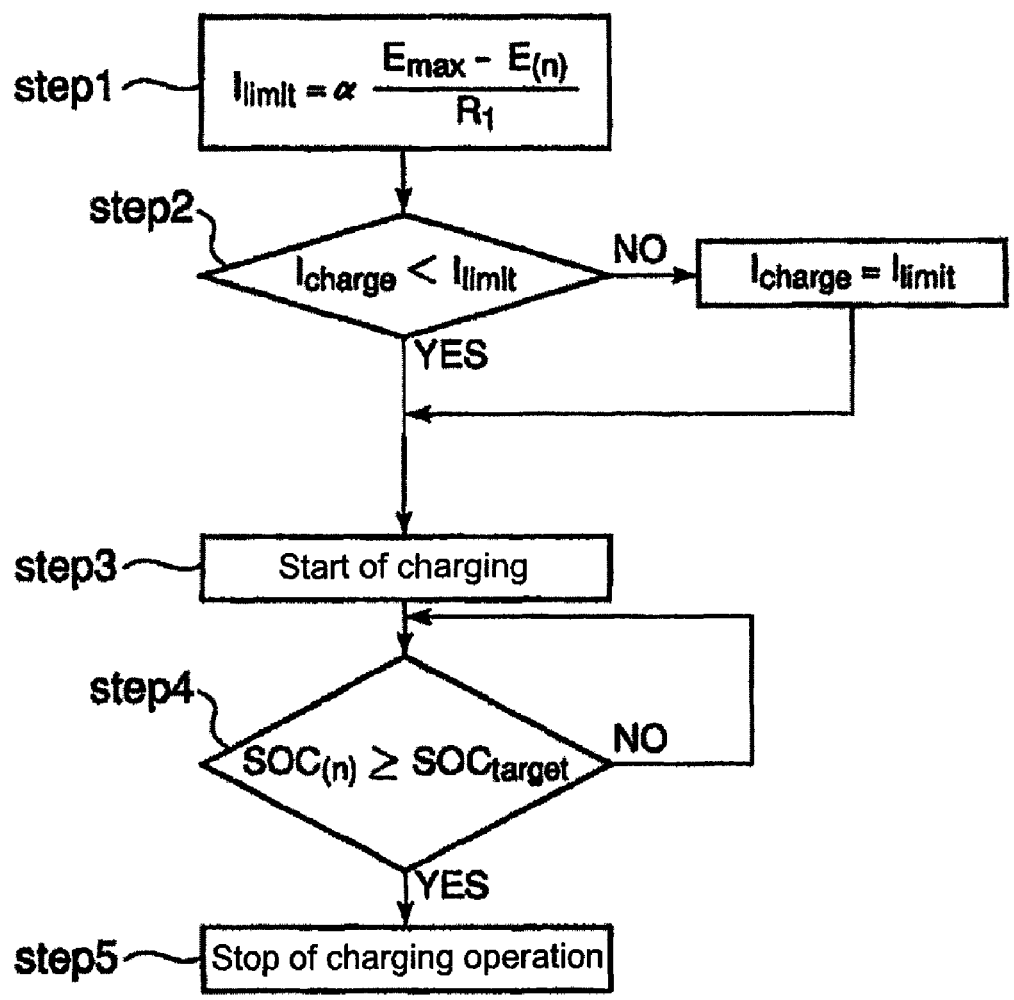
FIG. 8 is a flowchart of the charging method of the invention.

According to the embodiment, SOC of the second battery in a charged state can be calculated following the steps of a procedure mentioned above. After SOC in a charged state is calculated, charging operation is performed following steps of a procedure shown in FIG. 8. In FIG. 8, an upper limit value $I_{limit}$ of charging current is determined by multiplying ($E_{max}$−$E_{(n)}$)/$R_1$ by α, where $E_{max}$ is an upper limit of electromotive force (open circuit voltage) of the battery 14, $E_{(n)}$ is electromotive force of the battery calculated in step 8 of the flowchart of FIG. 3, and α is a safety factor. Charging current $I_{charge}$ is controlled so that it does not exceed a maximum limit in step 2, and charging is started (step 3). When SOC of the charged battery reached $SOC_{target}$, a target SOC of the battery to stop charging (step 4), charging operation is stopped (step 5).

Figure 9:
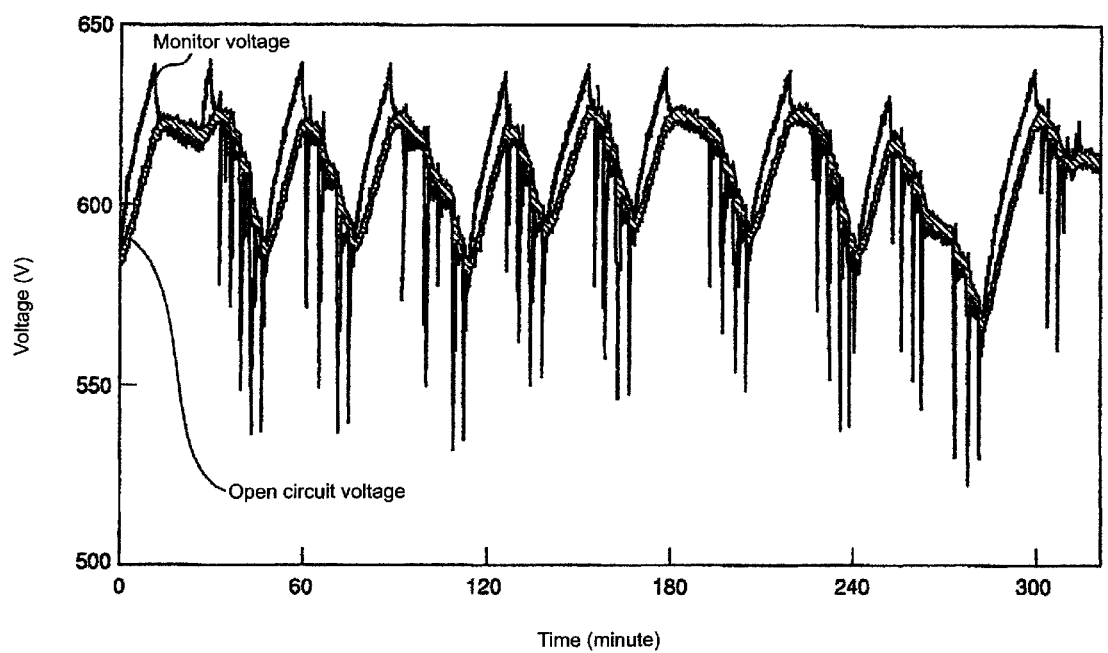
FIG. 9 is a graph showing an example of monitor voltage (V in FIG. 1) and open circuit voltage (E in FIG. 1).
Figure 10:
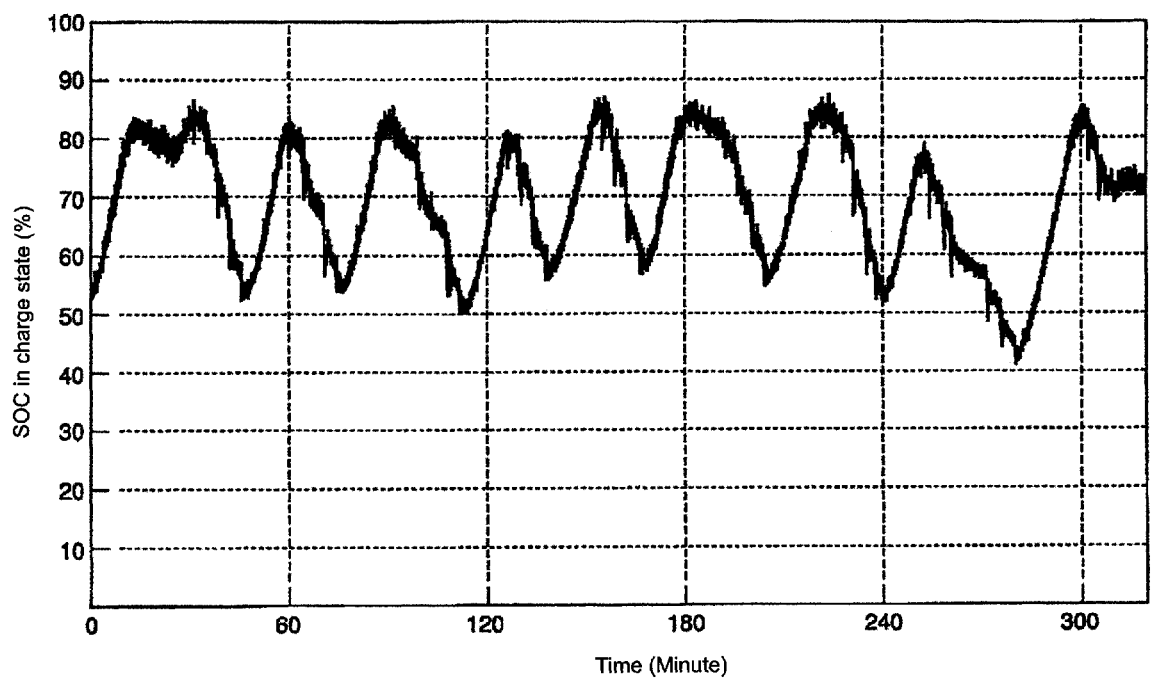
FIG. 10 is a graph showing transition as the time elapses of battery SOC estimated according to the invention.

An example of measurement of monitor voltage (V in FIG. 1) and open circuit voltage (E in FIG. 1) is shown in FIG. 9. It is recognized from FIG. 9 that open circuit voltage E is detected with voltage variation due to current supply being filtered. In FIG. 10 is shown an example of variation of battery SOC estimated according to the invention as the time elapses.

According to the embodiment, SOC in charged state of the second battery 14 mounted on the vehicle 1 can be estimated with accuracy, so SOC of battery can be maintained in an appropriate range. Therefore, occurrence of overcharge of over discharge of the secondary battery 14 can be prevented, and as a result deterioration of the second battery can be prevented.

Moreover, internal resistance of the secondary battery 14 can be monitored online, which is available for evaluating SOH (State of Health) of the secondary battery.

Furthermore, according to the method of charging battery according to the invention shown in FIG. 8, the upper limit value $I_{limit}$ of charging current is determined corresponding to the value of ($E_{max}$−$E_{(n)}$)/$R_1$ of the equivalent circuit of the battery 14 and charging is performed so that charging current does not exceed the upper limit value, so occurrence of overcharging of the battery can be prevented, deterioration of the battery can be prevented, charging current can be increased, and quick charge can be possible when the vehicle makes a stop at stations. Further, as charging is stopped when SOC of the battery calculated by the charged state battery SOC calculating means 12 reaches the predetermined target state-of-charge $SOC_{target}$, the battery can be charged to a desired state-of-charge in an appropriate range of SOC.

INDUSTRIAL APPLICABILITY

According to the invention, in a wireless transit system in which vehicles travel receiving electric power from batteries mounted on the vehicles, occurrence of overcharging and over discharging are prevented by charging the batteries to an appropriate state of charge of the batteries thereby preventing deterioration of the batteries, and charging current can be increased making it possible to perform quick charge when the vehicles make a stop at stations.

The invention claimed is:

1. A computer readable storage medium containing thereon a battery state of charge (SOC) estimation program execution by a computer to calculate an SOC of a battery mounted on a vehicle in a wireless transit system,
   wherein an equivalent circuit of the battery is set in the program, the equivalent circuit being composed of three circuit elements connected in series, including:
   (i) a first component resistance which is influenced by instantaneous current variation,
   (ii) a component circuit which comprises a capacitance and a second component resistance connected in parallel, and which is influenced by slow and excessive response, and
   (iii) an open circuit voltage of the battery, and wherein the program, when executed by the computer, causes the computer to calculate
   (a) a value of the first component resistance from measurements of current and voltage of the battery,
   (b) a value of the second component resistance from the calculated value of the first component resistance and a predetermined value of k, where
   k=the second component resistance/the first component resistance,
   (c) a value of the capacitance from the calculated value of the second component resistance and a predetermined value of τ, where
   τ=the capacitance×the second component resistance,
   (d) a potential of the component circuit from the calculated values of the second component resistance and the capacitance,
   (e) a value of the open circuit voltage from the calculated potential of the component circuit, and
   (f) the SOC from the calculated value of the open circuit voltage.

2. The computer readable storage medium of claim 1, wherein the predetermined values of k and τ are constant values.

3. The computer readable storage medium of claim 1, wherein the predetermined values of k and τ are constant values independent of a temperature of the battery.

4. The computer readable storage medium of claim 1, wherein the program, when executed on the computer, causes the computer to calculate the SOC from the calculated value of the open circuit voltage and the calculated value of the first component resistance.

5. A wireless transit system, comprising:
   a track;
   a plurality of ground facilities distributed along the track, each said ground facility comprising
      a charging power source device, and
      a ground power supply device connected to the charging power source device; and
   a vehicle comprising a battery and adapted to travel on the track by electric power supplied from the battery, said vehicle further comprising an in-vehicle power receiving device adapted to face the ground power supply device for charging the battery from the respective charging power source device when the vehicle makes a stop at any of the ground facilities, a current and voltage detector for detecting current and voltage of the battery, and a controller for calculating a state of charge (SOC) of the battery and for controlling the charging of the battery based on the SOC;

wherein an equivalent circuit of the battery is set as being composed of the three circuit elements connected in series, including:
(i) a first component resistance which is influenced by instantaneous current variation,
(ii) a component circuit which comprises a capacitance and a second component resistance connected in parallel, and which is influenced by slow and excessive response, and
(iii) an open circuit voltage of the battery, and wherein the controller is configured to calculate
(a) a value of the first component resistance from the detected current and voltage of the battery,
(b) a value of the second component resistance from the calculated value of the first component resistance and a predetermined value of k, where k=the second component resistance/the first component resistance, (c) a value of the capacitance from the calculated value of the second component resistance and a predetermined value of $\tau$, where $\tau$=the capacitance×the second component resistance, (d) a potential of the component circuit from the calculated values of the second component resistance and the capacitance,
(e) a value of the open circuit voltage from the calculated potential of the component circuit, and
(f) the SOC from the calculated value of the open circuit voltage.

6. The system of claim 5, wherein the predetermined values of k and $\tau$ are constant values.

7. The system of claim 5, wherein the predetermined values of k and $\tau$ are constant values independent of a temperature of the battery.

8. The system of claim 5, wherein the controller is configured to calculate the SOC from the calculated value of the open circuit voltage and the calculated value of the first component resistance.

9. The system of claim 5, wherein
the controller is configured to control the charging of the battery at a charging current that does not exceed an upper limit of charging current, and
the upper limit of charging current is determined based on a difference between (i) the calculated value of the open circuit voltage of the battery and (ii) a predetermined upper limit value of the open circuit voltage of the battery.

10. The system of claim 5, wherein the controller is configured to stop the charging of the battery when the calculated SOC of the battery reaches a predetermined SOC.

11. In a wireless transit system, a method of controlling charging of a battery mounted on a vehicle powered by the battery, wherein an equivalent circuit of the battery is set as being composed of three circuit elements connected in series, including:
(i) a first component resistance which is influenced by instantaneous current variation,
(ii) a component circuit which comprises a capacitance and a second component resistance connected in parallel, and which is influenced by slow and excessive response, and
(iii) an open circuit voltage of the battery, and said method comprising the following steps performed by a controller of the vehicle: determining a state of charge (SOC) of the battery by calculating
(a) a value of the first component resistance from the detected current and a voltage of the battery,
(b) a value of the second component resistance from the calculated value of the first component resistance and a predetermined value of k, where k=the second component resistance/the first component resistance, (c) a value of the capacitance from the calculated value of the second component resistance and a predetermined value of $\tau$, where $\tau$=the capacitance×the second component resistance, (d) a potential of the component circuit from the calculated values of the second component resistance and the capacitance,
(e) a value of the open circuit voltage from the calculated potential of the component circuit, and
(f) the SOC from the calculated value of the open circuit voltage; and controlling the charging of the battery based on the calculated SOC.

12. The method of claim 11, wherein the predetermined values of k and $\tau$ are constant values.

13. The method of claim 11, wherein the predetermined values of k and $\tau$ are constant values independent of a temperature of the battery.

14. The method of claim 11, wherein, in said calculating, the SOC is calculated from the calculated value of the open circuit voltage and the calculated value of the first component resistance.

15. The method of claim 11, wherein
in said controlling, the charging of the battery is performed at a charging current that does not exceed an upper limit of charging current, and
the upper limit of charging current is determined based on a difference between (i) the calculated value of the open circuit voltage of the battery and (ii) a predetermined upper limit value of the open circuit voltage of the battery.

16. The method of claim 11, further comprising
stopping the charging of the battery when the calculated SOC of the battery reaches a predetermined SOC.

* * * * *